(12) United States Patent
Xiao et al.

(10) Patent No.: US 7,486,121 B2
(45) Date of Patent: *Feb. 3, 2009

(54) SYSTEM AND METHOD FOR GENERATING TWO EFFECTIVE FREQUENCIES USING A SINGLE CLOCK

(75) Inventors: Kang Xiao, Irvine, CA (US); Steve Thomas, Riverside, CA (US); Robert Holder, Anaheim, CA (US); Timothy Chan, Diamond Bar, CA (US)

(73) Assignee: Broadcom Corporation, Irvine, CA (US)

( * ) Notice: Subject to any disclaimer, the term of this patent is extended or adjusted under 35 U.S.C. 154(b) by 506 days.

This patent is subject to a terminal disclaimer.

(21) Appl. No.: 10/938,467

(22) Filed: Sep. 9, 2004

(65) Prior Publication Data

US 2005/0034008 A1 Feb. 10, 2005

Related U.S. Application Data

(63) Continuation of application No. 10/342,639, filed on Jan. 15, 2003, now Pat. No. 6,844,764.

(51) Int. Cl.
*H03K 5/01* (2006.01)
*G01R 31/28* (2006.01)

(52) U.S. Cl. ........................ 327/165; 327/166; 714/716

(58) Field of Classification Search ................. 375/221, 375/364; 370/500, 249; 371/716; 257/778; 327/221, 364, 165–166; 714/716
See application file for complete search history.

(56) References Cited

U.S. PATENT DOCUMENTS

| | | | |
|---|---|---|---|
| 5,956,370 A * | 9/1999 | Ducaroir et al. | 375/221 |
| 6,662,332 B1 * | 12/2003 | Kimmitt | 714/762 |
| 6,807,193 B1 * | 10/2004 | Beser | 370/498 |
| 6,879,598 B2 * | 4/2005 | Zancan et al. | 370/463 |
| 6,898,217 B2 * | 5/2005 | Williams et al. | 372/20 |
| 7,111,208 B2 * | 9/2006 | Hoang et al. | 714/716 |
| 7,127,648 B2 * | 10/2006 | Jiang et al. | 714/715 |
| 7,173,942 B1 * | 2/2007 | Sutardja et al. | 370/463 |
| 7,203,227 B1 * | 4/2007 | Currivan et al. | 375/222 |

* cited by examiner

*Primary Examiner*—Dinh T. Le
(74) *Attorney, Agent, or Firm*—McAndrews, Held & Malloy, Ltd.

(57) ABSTRACT

A method and apparatus are disclosed for generating a second clock signal, having a second effective clock frequency, from a first clock signal, having a first effective clock frequency. Clock pulses of the first clock signal are counted to generate a count value. When the count value reaches a predetermined blanking value, a blanking signal is generated. The blanking signal blanks at least one clock pulse of the first clock signal. The process is repeated multiple times at a predetermined rate corresponding to the predetermined blanking value to generate the second clock signal.

2 Claims, 5 Drawing Sheets

SYSTEM AND METHOD FOR GENERATING TWO EFFECTIVE FREQUENCIES USING A SINGLE CLOCK

CROSS-REFERENCE TO RELATED APPLICATIONS/INCORPORATION BY REFERENCE

The present application is a Continuation of U.S. Non-Provisional Application having Ser. No. 10/342,639 filed on Jan. 15, 2003 now U.S. Pat. No. 6,844,764. The above named application is hereby incorporated herein by reference in its entirety. The present application also incorporates herein by reference in their respective entireties the following U.S. Pat. No. 6,721,380 issued on Apr. 13, 2004; U.S. Pat. No. 6,621,362 issued on Sep. 16, 2003; U.S. Pat. No. 6,526,113 issued on Feb. 25, 2003; U.S. Pat. No. 6,424,194 issued on Jul. 23, 2002; U.S. Pat. No. 6,389,092 issued on May 14, 2002; U.S. Pat. No. 6,340,899 issued on Jan. 22, 2002; and the following pending U.S. application: Ser. No. 09/969,837 filed on Oct. 1, 2001; U.S. application Ser. No. 10/159,788 filed on May 30, 2002; U.S. application Ser. No. 10/179,735 filed on Jun. 21, 2002; and U.S. application Ser. No. 10/340,408 filed on Jan. 10, 2003.

FEDERALLY SPONSORED RESEARCH OR DEVELOPMENT

[Not Applicable]

SEQUENCE LISTING

[Not Applicable]

MICROFICHE/COPYRIGHT REFERENCE

[Not Applicable]

BACKGROUND OF THE INVENTION

Embodiments of the present invention relate generally to a method and apparatus for generating clock signals in a high-speed digital transceiver, and more particularly to generating a second clock signal from a first clock signal.

High-speed digital communication networks over copper and optical fiber are used in many network communication and digital storage applications. Ethernet and Fibre Channel are two widely used communication protocols used today and continue to evolve to respond to the increasing need for higher bandwidth in digital communication systems.

The Open Systems Interconnection (OSI) model (ISO standard) was developed to establish standardization for linking heterogeneous computer and communication systems. The OSI model includes seven distinct functional layers including Layer 7: an application layer; Layer 6: a presentation layer; Layer 5: a session layer; Layer 4: a transport layer; Layer 3: a network layer; Layer 2: a data link layer; and Layer 1: a physical layer. Each OSI layer is responsible for establishing what is to be done at that layer of the network but not how to implement it.

Layers 1 to 4 handle network control and data transmission and reception. Layers 5 to 7 handle application issues. Specific functions of each layer may vary to a certain extent, depending on the exact requirements of a given protocol to be implemented for the layer. For example, the Ethernet protocol provides collision detection and carrier sensing in the data link layer.

The physical layer, Layer 1, is responsible for handling all electrical, optical, and mechanical requirements for interfacing to the communication media. The physical layer provides encoding and decoding, synchronization, clock data recovery, and transmission and reception of bit streams. Typically, high-speed electrical or optical transceivers are the hardware elements used to implement this layer.

As data rate and bandwidth requirements increase, 10 Gigabit data transmission rates are being developed and implemented in high-speed networks. There is much pressure to develop a 10 Gigabit physical layer for high-speed serial data applications.

In the physical layer, several sublayers are supported. As an example, for 10 Gigabit serial operation, some of the key sublayers include a PMD TX/RX (physical media dependent transmit and receive) sublayer, a PMD PCS (physical media dependent physical encoding) sublayer, a XGXS PCS (10 Gigabit media independent interface extender physical encoding) sublayer, and a XAUI TX/RX (10 Gigabit attachment unit interface transmit and receive) sublayer.

An optical-based transceiver, for example, includes various functional components such as clock data recovery, clock multiplication, serialization/de-serialization, encoding/decoding, electrical/optical conversion, descrambling, controlling, and data storage.

Certain functional components within an optical-based transceiver may require clock signals having slightly different effective clock frequencies. For example, a clock data recovery (CDR) circuit and a synchronizer/descrambler/decoder circuit may require slightly different effective clock frequencies in an optical-based transceiver. Typically, the clock signals are generated independently of each other, or one clock signal is multiplied up and then divided down by large ratios to achieve a second clock signal. Such methods require significant additional hardware than that required for generating a single original clock signal.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

Certain embodiments of the present invention provide a method and apparatus for generating a second clock signal from a first clock signal where the effective clock frequencies of the two clock signals differ slightly.

Aspects of the present invention may be found in a transceiver device comprising a transmitter, a receiver, a controller, and a plurality of sub-layers. The transceiver device may at least provide functionality to transmit and receive information via a plurality of serial paths at aggregate speeds of at least 10 Gigabit per second. The transmitter, the receiver, the controller, and the plurality of sub-layers may be integrated on a single chip.

Aspects of the present invention may also be found in a transceiver device comprising a single integrated circuit. The single integrated circuit may comprise a transmitter, a receiver, a controller, and a plurality of sub-layers. The transceiver device may at least provide functionality to transmit and receive information via a plurality of serial paths at aggregate speeds of at least 10 Gigabit per second. The transmitter, the receiver, the controller, and the plurality of sub-layers may be integrated on a single chip.

These and other advantages, aspects and novel features of the present invention, as well as details of an illustrated

DETAILED DESCRIPTION OF THE INVENTION

Figure 1:
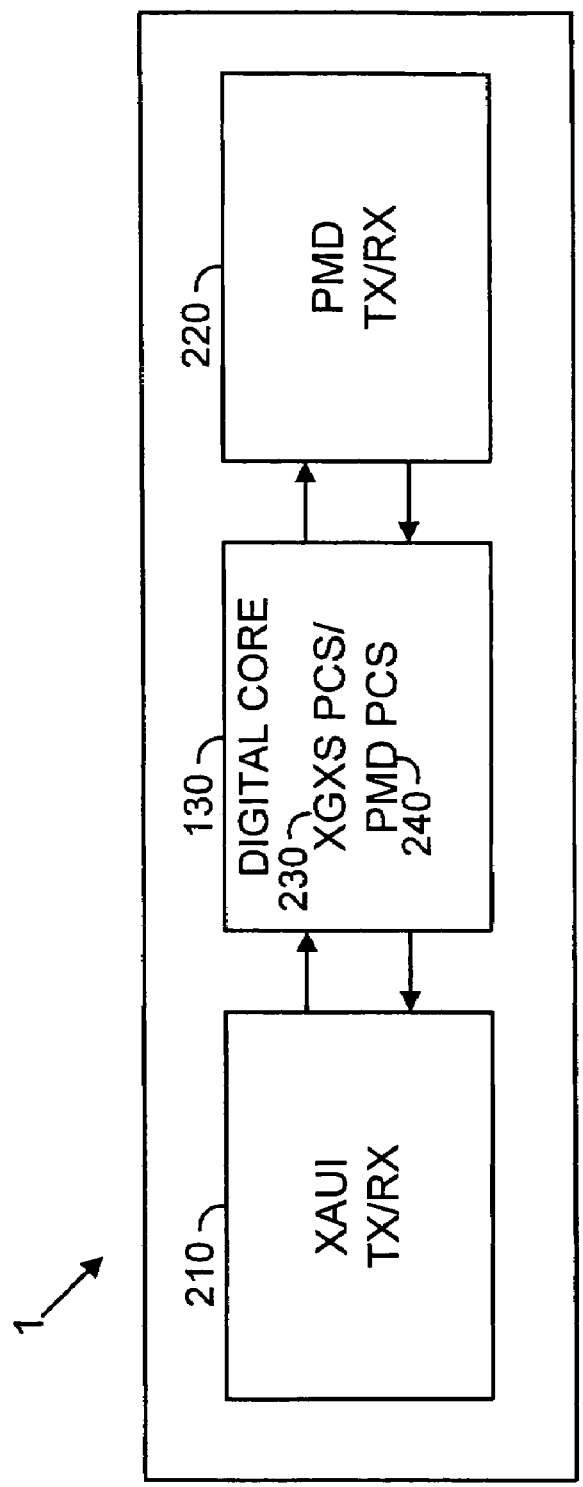
FIG. 1 is a top-level block diagram of an optical-based transceiver chip in accordance with an embodiment of the present invention.

FIG. 1 is a top-level block diagram of an optical-based transceiver chip 1 in accordance with an embodiment of the present invention. The PMD TX/RX sublayer 220 (physical media dependent transmit and receive sublayer) provides the electrical functionality for transmission and reception of 10 Gigabit serial data. The functionality includes clock multiplication and data serialization, clock data recovery and data de-serialization, signal amplification and equalization, and differential signal driving.

The PMD PCS sublayer 240 (physical media dependent physical encoding sublayer) is responsible for coding data to be transmitted and decoding data to be received on the PMD side of the transceiver. The functionality includes 64B/66B synchronization, descrambling, and decoding, 64B/66B encoding and scrambling, data transitioning, multiplexing, and phase detecting.

The XGXS PCS sublayer 230 (10 Gigabit media independent interface extender physical encoding sublayer) is responsible for coding data to be transmitted and decoding data to be received on the XAUI side of the transceiver. The functionality includes 8B/10B encoding, 8B/10B decoding, randomizing, and lane alignment.

The XAUI TX/RX sublayer 210 (10 Gigabit attachment unit interface transmit and receive sublayer) provides the electrical functionality for transmission and reception of 3 Gigabit 4-channel serial data. The functionality includes clock multiplication and data serialization, clock data recovery and data de-serialization, signal amplification, and differential signal driving.

Figure 2:
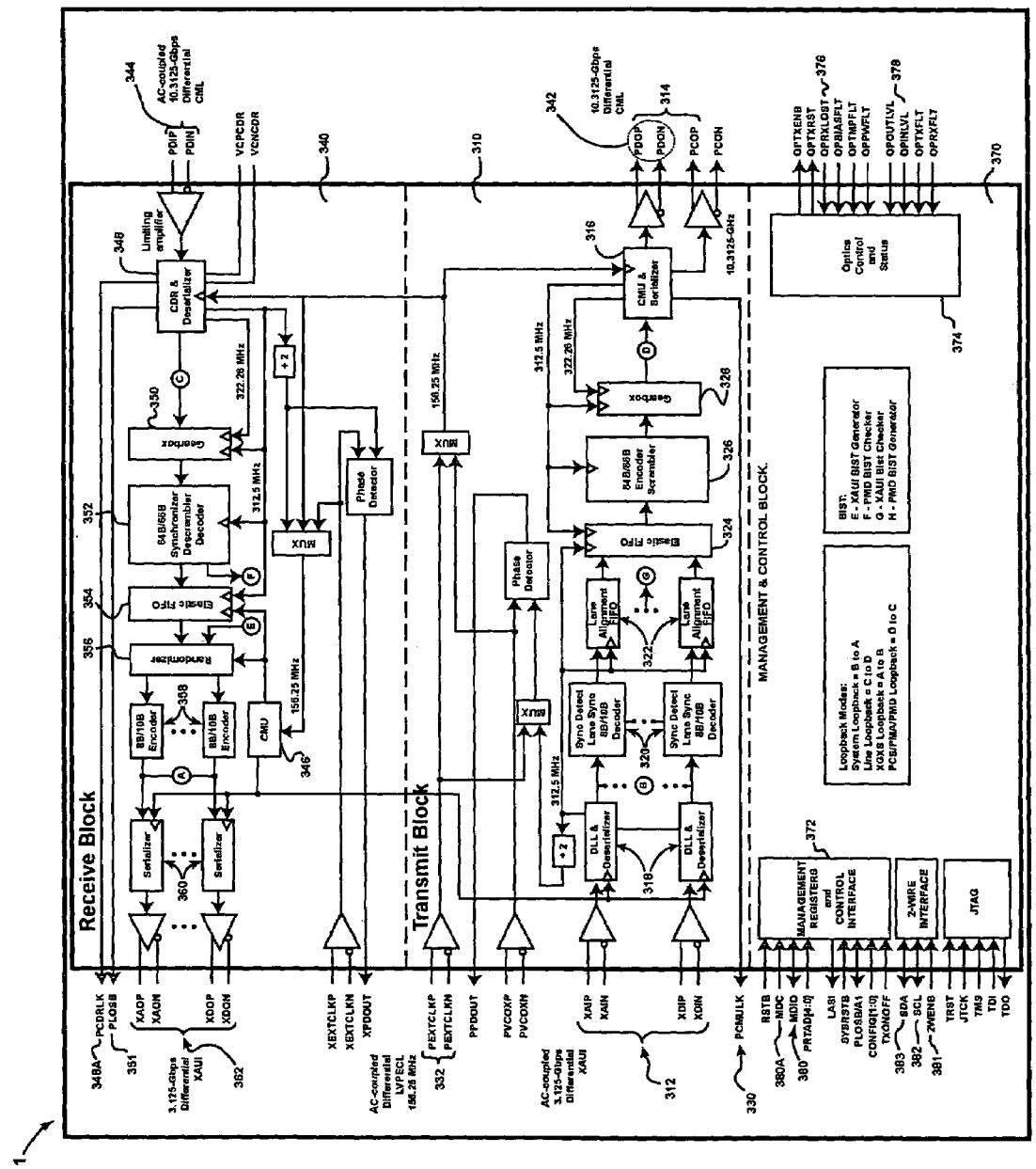
FIG. 2 is a more detailed schematic block diagram of the optical-based transceiver chip of FIG. 1 in accordance with an embodiment of the present invention.

FIG. 2 is a more detailed schematic block diagram of the optical-based transceiver chip 1 of FIG. 1 in accordance with an embodiment of the present invention. The optical-based transceiver chip 1 comprises three main blocks including a transmit block 310, a receive block 340, and a management and control block 370. Clock interfaces are provided for configuring the XAUI and PMD interfaces to asynchronous or independent asynchronous operations in accordance with an embodiment of the present invention.

The receiver block 340 accepts 10 Gigabit serial PMD data and reformats the data for transmission on the 4-lane 3 Gigabit XAUI transmitters 362. One of the 3 Gigabit CMU clocks in the XAUI TX/RX sublayer 210 is used to retime all four XAUI transmitters. The XAUI CMU 346 in the XAUI TX/RX sublayer 210 is phase-locked to an external reference clock.

The PMD clock and data recovery (CDR)/Deserializer 348 within the PMD TX/RX sublayer 220 generates a clock that is at the same frequency as the incoming data bit rate (10 Gigabit data rate) at the serial data inputs, PDIP/N 344. The clock is phase-aligned by a PLL so that it samples the data in the center of the data eye pattern in accordance with an embodiment of the present invention.

The phase relationship between the edge transitions of the data and those of the generated clock are compared by a phase/frequency discriminator. Output pulses from the discriminator indicate the direction of phase corrections.

The output of the loop filter controls the frequency of the VCO, which generates the recovered clock. Frequency stability without incoming data is guaranteed by an internal reference clock that the PLL locks onto when data is lost.

The transceiver chip 1 includes a lock detect circuit that monitors the 10 Gigabit frequency of the internal VCO within the PMD TX/RX sublayer 220. The frequency of the incoming data stream is within ±100 ppm of the 10 Gigabit data stream for the lock detector to declare signal lock. The lock detect status is observable in the Analog Transceiver Status Register 0. P_LKDTCDR goes high when the PMD CDR/Deserializer 348 is locked to the incoming data. The CDR lock detect signal is also provided as an output status at the PCDRLK pin 348A.

The PMD serial data stream is deserialized by a serial-to-parallel converter of CDR/Deserializer 348 in the PMD TX/RX sublayer 220. The CDR output clocks the serial-to-parallel converter. Under normal operation, the CDR recovers the clock from the data. If data is not present, the clock is recovered from the internal reference clock. The output is sent to the RX Gearbox 350 within PMD PCS sublayer 240.

The RX gearbox 350 in the PMD PCS sublayer 240 is a buffer that converts 64-bit data to 66-bit data for more efficient parallelization. The RX gearbox 350 receives 64-bit data from the CDR/Deserializer 348 at 322.265 MHz. The RX gearbox 350 outputs 66-bit data to the 64B/66B Synchronizer/Descrambler/Decoder 352 within the PMD TX/RX sublayer 220. A register bank is employed which is accessed in a circular manner.

A Frame Synchronizer (which is a part of the 64B/66B Synchronizer/Descrambler/Decoder 352 in the PMD PCS sublayer 240) searches for the 66-bit boundary of the frame data and obtains lock to 66-bit blocks using the sync header and outputs 66-bit blocks. The descrambler (which is also a part of the 64B/66B Synchronizer/Descrambler/Decoder 352 in the PMD PCS sublayer 240) processes the payload to reverse the effect of the scrambler using the same polynomial. The receiver process decodes blocks according to IEEE 802.3ae clause 49.

The XAUI CMU 346 within the XAUI TX/RX sublayer 210 has a PLL that generates the 3 Gigabit clock by multiplying the internal 156.25-MHz reference clock in accordance with an embodiment of the present invention. The transceiver chip 1 includes a lock detect circuit, which monitors the frequency of the internal VCO. The CMU lock detect bit goes high when the XAUI CMU PLL is locked. The lock detect status is in the Analog Transceiver Status Register 0, bit 7.

The transceiver chip 1 supports asynchronous clocking mode operation of the XAUI and PMD interfaces. The local reference clock or external transmit VCXO may adhere to the IEEE specifications.

In the asynchronous mode, an elastic FIFO 354 is used that accommodates a frequency difference of up to 200 ppm between a recovered clock and a local reference clock. Both the RX and TX data paths 310 and 320 contain elastic FIFOs 354 and 324. Idle columns of four bytes are inserted or deleted during the IPG (inter packet gap) once the distance between the elastic FIFO's read and write pointers exceed a threshold. In addition, a column of sequence orders may be deleted during the IPG once the distance between the elastic FIFO's read and write pointer exceed a threshold. The delete adjustments only occur on IPG streams that contain at least two columns of idles or sequence order sets.

In an embodiment of the present invention, a 312.5 MHz clock signal is derived from a 322.26 MHz clock signal. For example, in the receive block 340, the CDR/Deserializer 348 generates a first clock signal at an effective clock frequency of 322.26 MHz that is used to clock one side of the RX gearbox 350. A second clock signal is generated within the CDR/Deserializer 348 from the first clock signal at an effective frequency of 312.5 MHz. The second clock signal at 312.5 MHz is used to clock another side of the RX gearbox 350, the 64B/66B Synchronizer/Descrambler/Decoder 352, and the elastic FIFO 354. Also, the second clock signal at 312.5 MHz is divided by 2 to form a 156.25 MHz clock signal and may be muxed to the XAUI CMU 346.

Figure 3:
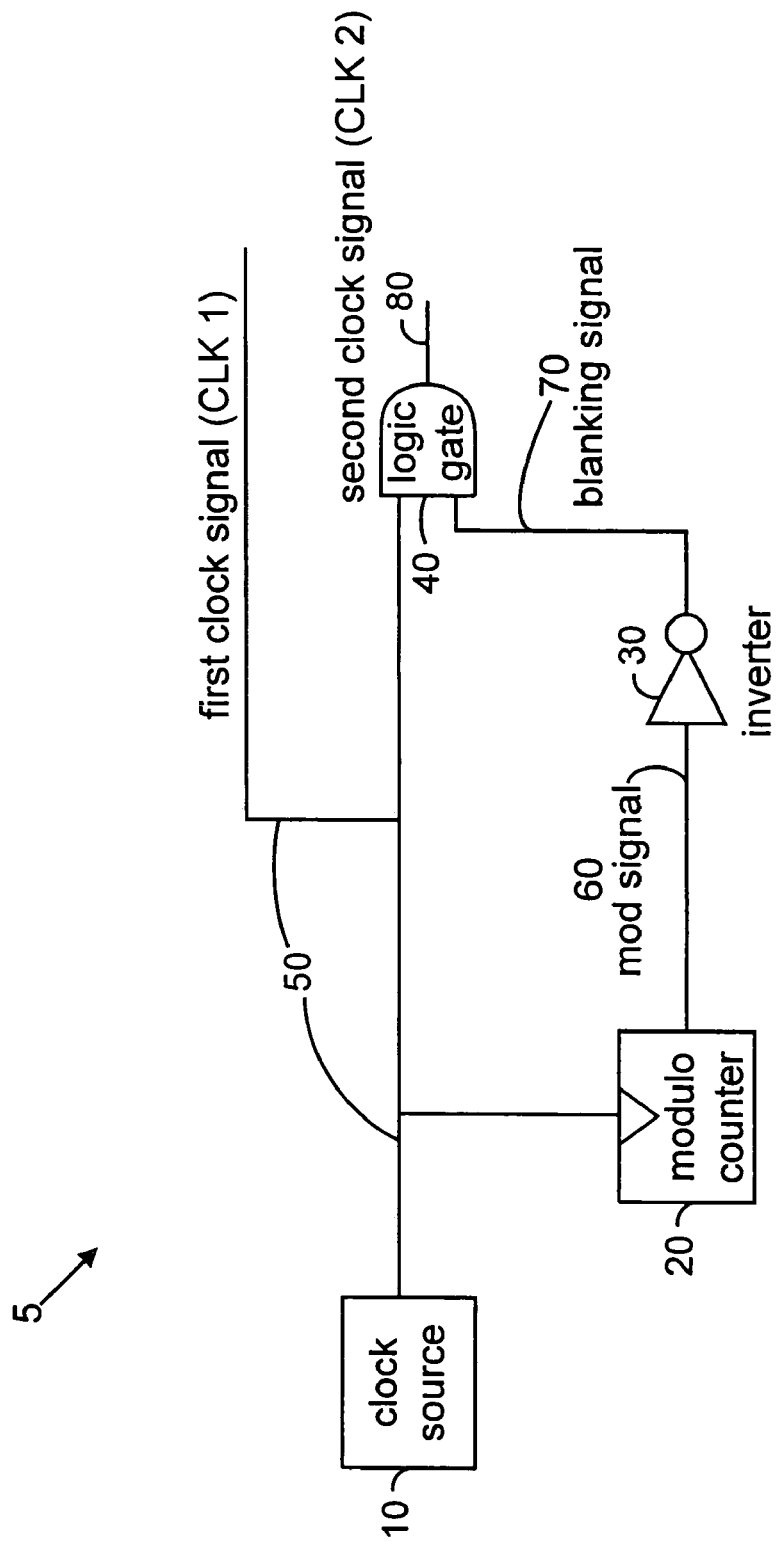
FIG. 3 is a schematic block diagram of an apparatus within the optical-based transceiver chip of FIG. 2 to generate a second clock signal from a first clock signal in accordance with an embodiment of the present invention.

Referring to FIG. 3, in an embodiment of the present invention, the clock generating circuit 5 may be used to generate the second clock signal (CLK 2) from the first clock signal (CLK 1). The first clock signal 50 at 322.26 MHz is generated by a clock source 10 within CDR/Deserializer 348. The clock source 10 may be a circuit that derives the first clock signal 50 from another clock signal or may be an original clock source.

Figure 4:
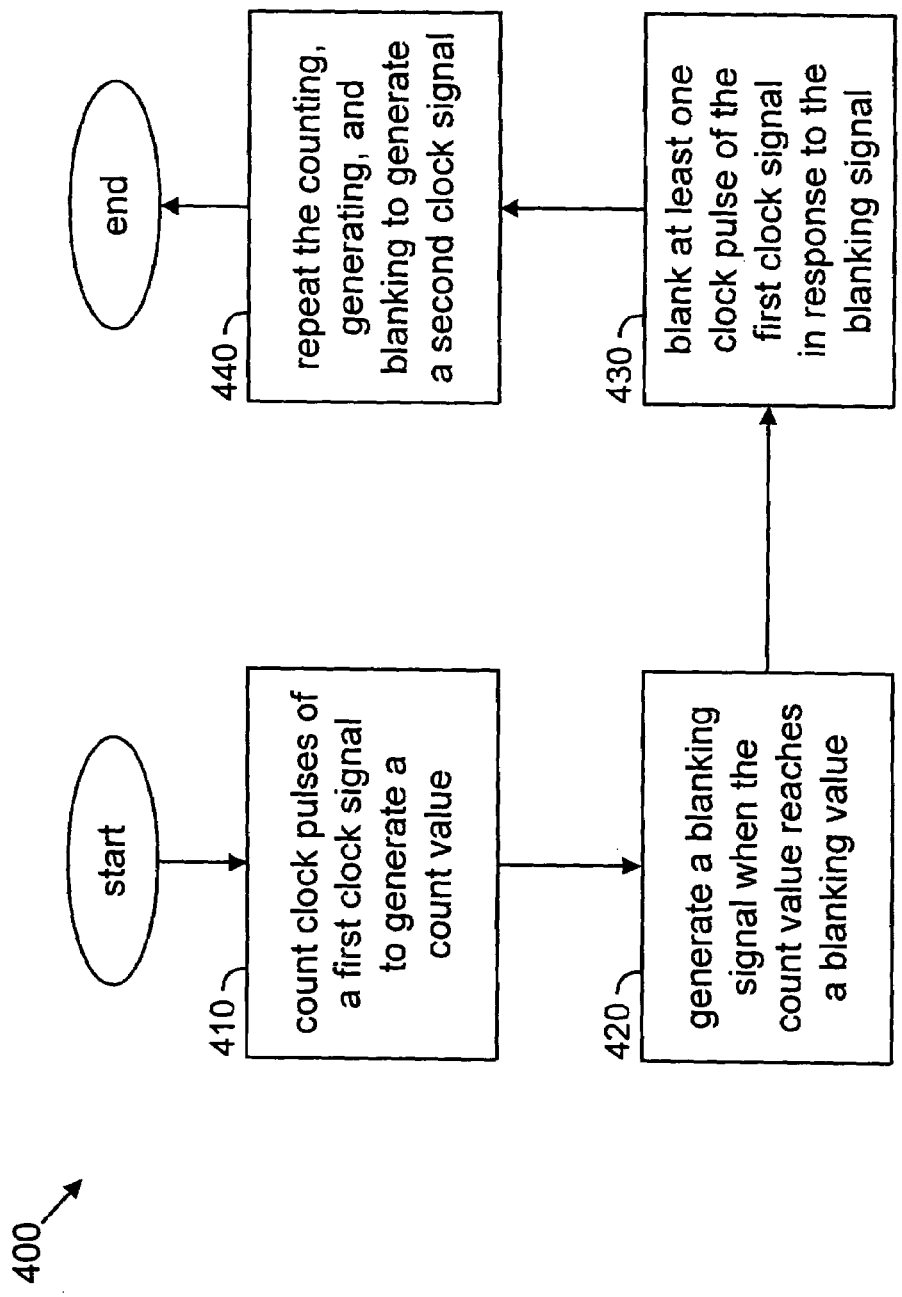
FIG. 4 is flowchart of a method to generate a second clock signal from a first clock signal using the apparatus of FIG. 3 in accordance with an embodiment of the present invention.

A modulo counter 20 is used to count clock pulses of the first clock signal 50 to generate a count value as described in step 410 of FIG. 4. In step 420, the modulo counter outputs a mod signal 60 to an inverter 30 when the count value of the modulo counter 20 reaches a predetermined blanking value. As a result, the inverter 30 outputs a blanking signal 70 to blank at least one clock pulse of the first clock signal 50 in step 430. In step 430, the first clock signal 50 and the blanking signal 70 are input to a logic gate (e.g. an AND gate) 40. The output of the logic gate 40 is the second clock signal (CLK 2) 80.

Figure 5:
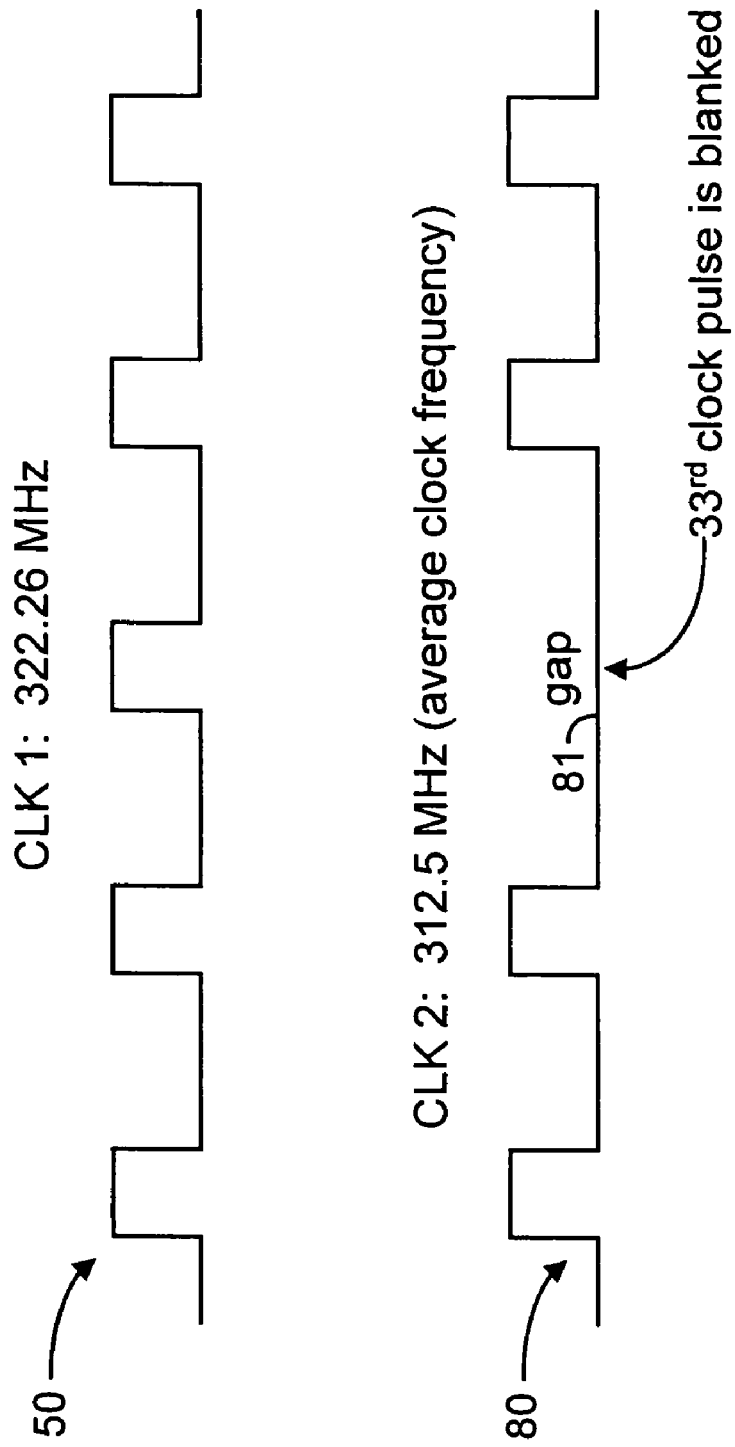
FIG. 5 is a timing diagram of the first clock signal and the second clock signal with a blanked pulse (gap) in accordance with an embodiment of the present invention.

Referring to FIG. 5, in accordance with an embodiment of the present invention, when the predetermined blanking value is 33, every $33^{rd}$ clock pulse in CLK 1 50 will be blanked creating a gap 81 in CLK 2 80. As a result, the effective clock frequency of CLK 2 80 will be 312.5 MHz as follows:

$$[(33-1)/33]*322.26 \text{ MHz} = 312.5 \text{ MHz} \quad \text{(eqn. 1)}$$

The transmit block 310 collects 4-lane 3 Gigabit data at the XAUI receivers 312 and reformats the data for 10 Gigabit serial transmission at the PMD differential CML drivers 314 in accordance with an embodiment of the present invention. The PMD CMU (clock multiplier unit)/Serializer 316 in the PMD TX/RX sublayer 220 is phase-locked to an external reference clock.

Each XAUI serial data stream is de-serialized to a 10-bit word by a serial-to-parallel converter of the DLL & Deserializer 318 within the XAUI TX/RX sublayer 210. The DLL output clocks the serial-to-parallel converter. Under normal operation, the DLL recovers the clock from the data. If data is not present, the clock is recovered from the internal reference clock. The output is sent to the XGXS PCS sublayer 230 in the digital core 130.

The PMD PCS sublayer 240 uses a transmission code to improve the transmission characteristics of information to be transferred across the link and to support transmission of control and data characters in accordance with an embodiment of the present invention. The 64B/66B encoding (defined by IEEE 802.2ae clause 49 for transmission code and performed by the 64B/66B Encoder/Scrambler 326) ensures that sufficient transitions are present in the PHY bit stream to make clock recovery possible at the receiver.

The TX gearbox 328 in the PMD PCS sublayer 240 is a buffer that converts 66-bit data to 64-bit data for more efficient serialization. The TX gearbox 328 receives 64-bit data from the 64B/66B Encoder/Scrambler 326 and a 2-bit sync from the Type Generator at 156.25 MHz. The TX gearbox 328 outputs 64-bit data at 322.265 MHz to the PMD CMU/Serializer 316 within the PMD TX/RX sublayer 220. A register bank is employed which is accessed in a circular manner.

Data is read out of the TX gearbox 328 using an internally generated 322.265 MHz clock. The data is converted to a 10 Gigabit serial stream within PMD TX/RX sublayer 220 and driven off-chip. Bit 0 of frame 0 (LSB) is shifted out first.

The PMD CMU/Serializer 316 within the PMD TX/RX sublayer 220 has a PLL that generates the 10 Gigabit clock by multiplying the internal 156.25 MHz reference clock.

As another example, in the transmit block 310, the CMU/Serializer 316 generates a first clock signal at an effective clock frequency of 322.26 MHz that is used to clock one side of the TX gearbox 328. A second clock signal is generated within the CMU/Serializer 316 from the first clock signal at an effective frequency of 312.5 MHz. The second clock signal at 312.5 MHz is used to clock another side of the TX gearbox 328, the 64B/66B Encoder/Scrambler 326, and the elastic FIFO 324.

In an embodiment of the present invention, the clock generating circuit 5 may be similarly used, as in the receive block 340, to generate the second clock signal from the first clock signal according to the method 400.

In other embodiments of the present invention, other clock signals at other effective clock frequencies may be generated from an original clock signal at some first clock frequency. Embodiments of the present invention are not limited to any particular first clock frequency or second clock frequency. Also, multiple clock pulses may be blanked during one cycle of the blanking signal to obtain a particular effective clock frequency for the second clock signal.

In alternative embodiments of the present invention, the clock generating apparatus 5 and method 400 may not be part of a transceiver chip but may, instead, be a part of some other circuitry where it is desirable to generate a second clock signal from a first clock signal.

The various elements of the apparatus 5 may be combined or separated according to various embodiments of the present invention.

In summary, certain embodiments of the present invention afford an approach for generating a second clock signal, having a second effective clock frequency, from a first clock signal, having a first effective clock frequency by blanking clock pulses from the first clock signal at regular intervals.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An integrated circuit comprising:

a clock data recovery deserializer for deserializing data from a physical media dependent transmit and receive sublayer, said clock data recovery deserializer comprising:

a clock source for providing a first clock signal;

a modulo counter for counting clock pulses of the first clock signal and generating a blanking signal when said count value reaches a predetermined value; and logic for blanking at least one pulse of said first clock signal after receiving the blanking signal.

2. The integrated circuit of claim 1, wherein the logic further comprises:

an inverter for inverting the blanking signal; and an AND gate for generating a second clock signal from the inverter and the clock source.

* * * * *